United States Patent
Wikström

[19]

[11] Patent Number: 6,046,573
[45] Date of Patent: Apr. 4, 2000

[54] SYSTEM FOR EQUALIZING THE LEVEL OF CHARGE IN BATTERIES

[75] Inventor: Bo Wikström, Malmö, Sweden

[73] Assignee: Xicon Battery Electronics AB, Malmo, Sweden

[21] Appl. No.: 09/066,333

[22] PCT Filed: Oct. 30, 1996

[86] PCT No.: PCT/SE96/01390

§ 371 Date: Jul. 23, 1998

§ 102(e) Date: Jul. 23, 1998

[87] PCT Pub. No.: WO97/16879

PCT Pub. Date: May 9, 1997

[30] Foreign Application Priority Data

Oct. 31, 1995 [SE] Sweden ................................... 9503861

[51] Int. Cl.[7] .............................................. H01M 10/46
[52] U.S. Cl. ............................................................. 320/118
[58] Field of Search ................................... 320/116, 118, 320/119, 120, 122

[56] References Cited

U.S. PATENT DOCUMENTS

| | | | |
|---|---|---|---|
| 4,331,911 | 5/1982 | Park | 320/119 |
| 5,313,152 | 5/1994 | Wozniak et al. | 320/118 |
| 5,592,067 | 1/1997 | Peter et al. | 320/118 X |
| 5,631,534 | 5/1997 | Lewis | 320/119 X |
| 5,646,504 | 7/1997 | Feldstein | 320/119 |
| 5,767,660 | 6/1998 | Schmidt | 320/119 X |

*Primary Examiner*—Edward H. Tso
*Attorney, Agent, or Firm*—Finnegan, Henderson, Farabow, Garrett & Dunner, L.L.P.

[57] ABSTRACT

A system for equalizing the charge level of batteries comprising battery cells (3) or battery blocks (9) connected in series. Controlled voltage converters (4) are on one side connected to a single or groups of battery cells (3) or battery blocks (9) and on another side connected to a common current path (5, 6), a positive conductor (5) thereof being connected to a positive pole (1) of the battery and the negative pole (6) thereof being connected to a negative pole (2) of the battery.

8 Claims, 3 Drawing Sheets

SYSTEM FOR EQUALIZING THE LEVEL OF CHARGE IN BATTERIES

TECHNICAL FIELD

The presently most used way to charge and discharge batteries is to connect charging or load to the pole bolts of the total battery. The battery consists normally of a number of cells which are connected in series. At charging or discharging the same current will go through all the battery cells.

PRIOR ART

In charging or discharging of batteries there are normally a control systems, with varying degree of complexity, which control the process. Charging or discharging is done by supplying or loading a current in the battery. The size of this current is controlled by a number of parameters e.g. current battery voltage, temperature at battery, battery performance, current charging level etc. One problem which occurs with the use batteries connected in series is that the battery cells have different pole voltages, temperatures, performance, charging levels etc. One method, which is used to minimize this problem, is to equally discharge the battery. I.e. that the whole battery is emptied of energy to get the cells on as equal a charging level as possible, at the next charging cycle. As the demands of availability and lifetime increase, charging systems have been developed which can equalise charging. These systems have an electrical connection to each battery cell or battery block. This means that the main charging current is supplied as usual via the pole bolts. In addition, extra currents, to the battery cells or battery blocks which need extra charging to reach full charging level, can be supplied via the separate connections. One disadvantage with this type of system is that the cable arrangement becomes very complex, and that equalising only can be done at charging.

SUMMARY OF THE INVENTION

An object of the present invention is to considerably avoid the above mentioned problems and by an equalising system direct charging currents between different battery cells or battery blocks in the battery during all operating conditions, without having an inconvenient cable installation.

These objects are achieved by a voltage converter, mounted on each battery cell or battery block. These voltage converter units are connected to a common current path, which is connected to the pole bolts, of the total battery, where the energy is transferred from the cells which have a higher charging level, temperature, pole voltage etc. As this current path is connected to the pole bolts of the total battery an equalisation of the charging levels is made.

The system can also have an alternative technical solution where energy is transferred from the common current path via the voltage converter units to the respective battery cell or battery block. The energy is now transferred in the opposite direction, compared to the above solution, but this gives the same effect if the energy now is supplied to the battery cells or battery blocks which have a lower charging level, temperature, pole voltage etc. compared to the other battery cells or battery blocks.

BRIEF DESCRIPTION OF THE DRAWINGS

The invention will now be described below with the schematic connection diagrams where.

DETAILED DESCRIPTION

Figure 1:
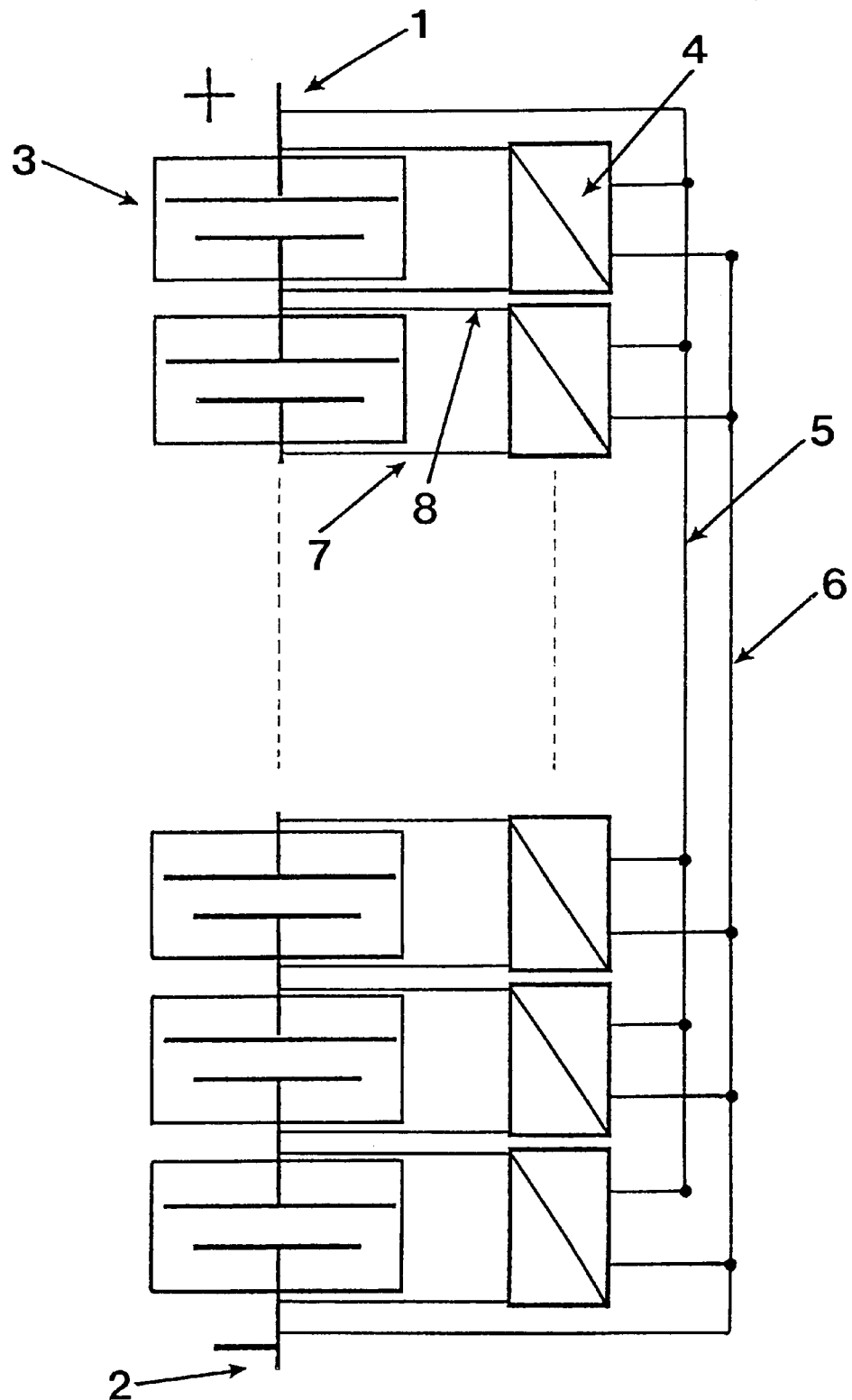
FIG. 1 shows a battery where the charge level equalising system is connected to each battery cell in the battery.
Figure 2:
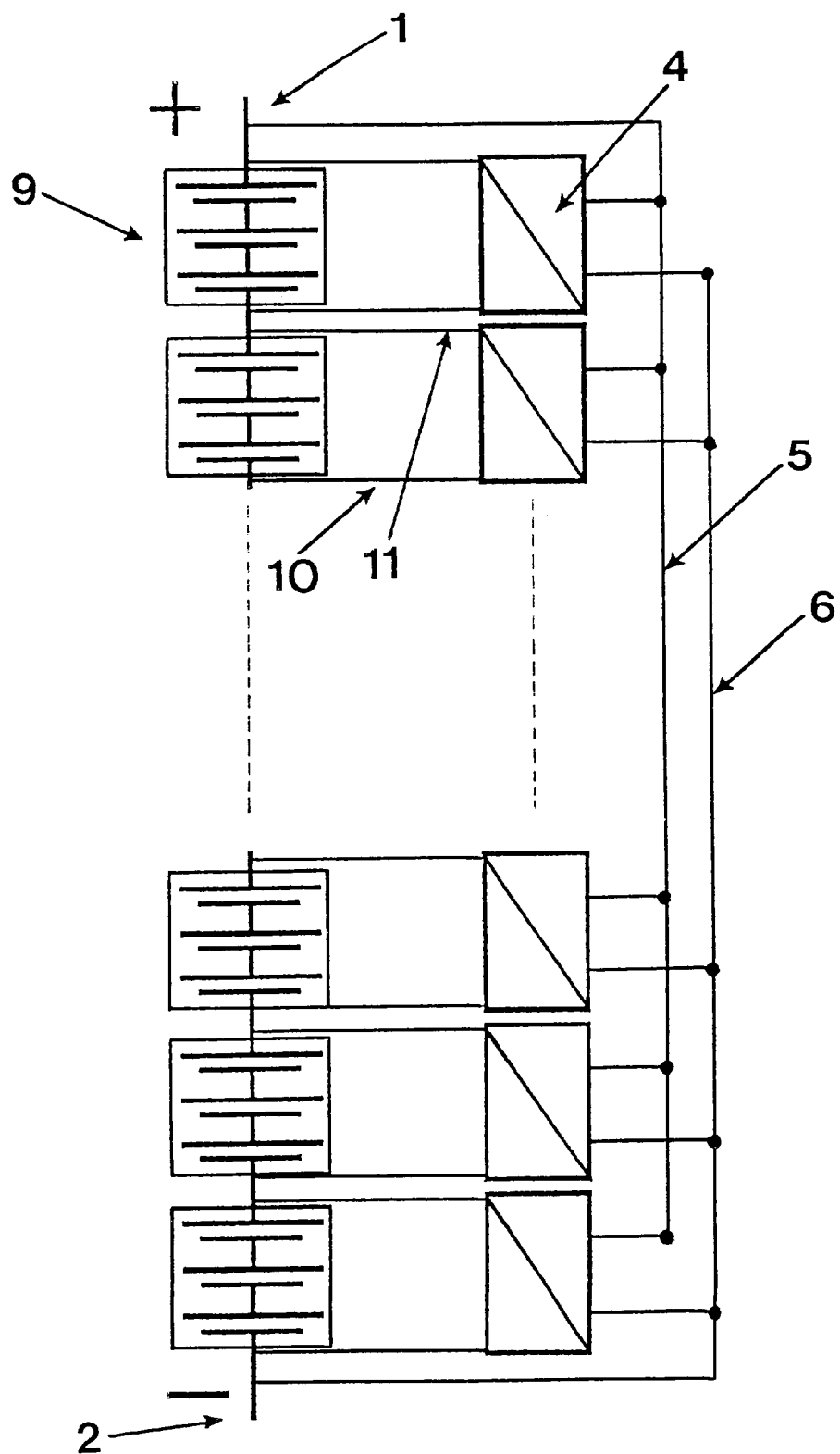
FIG. 2 shows a battery where the charge level equalising system is connected to each battery block in the battery.

FIG. 1 shows in principal a connection diagram of a system for charge level equalising in batteries, where the system is connected to the battery cell level. The battery having a positive pole 1 and a negative pole 2 comprises a number of cells 3 connected in series. The system for charge level equalising comprises a number of voltage converters 4 which are remotely controlled by a in relation to the battery centrally oriented control unit. The voltage converters 4 are on one side connected to positive pole 8 and negative pole 7, respectively, of the battery cells and the positive pole 10 and negative pole 11 respectively of the battery blocks as shown in FIG. 2. The voltage converters 4 are on the other side connected to a positive pole 5 and a negative pole 6 of a common current path. The positive pole 5 of the common current path is connected to the positive pole 1 of the battery. The negative pole 6 of the common current path is connected to the negative pole 2 of the battery.

The voltage converters 4 can be designed to obtain energy from one or more battery cells 3 and transfer the energy to the common current path 5,6. Alternatively the voltage converters 4 can be designed to obtain energy from the common current path 5,6 and transfer energy to one or several battery cells 3.

FIG. 2 shows in principal a connection diagram of a system for charge level equalising where the system has been connected to battery block level 9. The function of the system is equal to that described with reference to FIG. 1 with the exception that the battery cells 3 have been replaced by the battery blocks 9.

The system for charge level equalising in batteries can be controlled by different algorithms, which means during the charging phase of the total battery, in spite of the series connections, a part of the charging current can be directed to the different battery cells 3 or the battery blocks. In this way these can be charged individually to the intended level. In the same way as discharging of the battery, in spite of connections in series, the current can be directed to the intended level for respective battery cell 3 or battery block 9.

Figure 3:
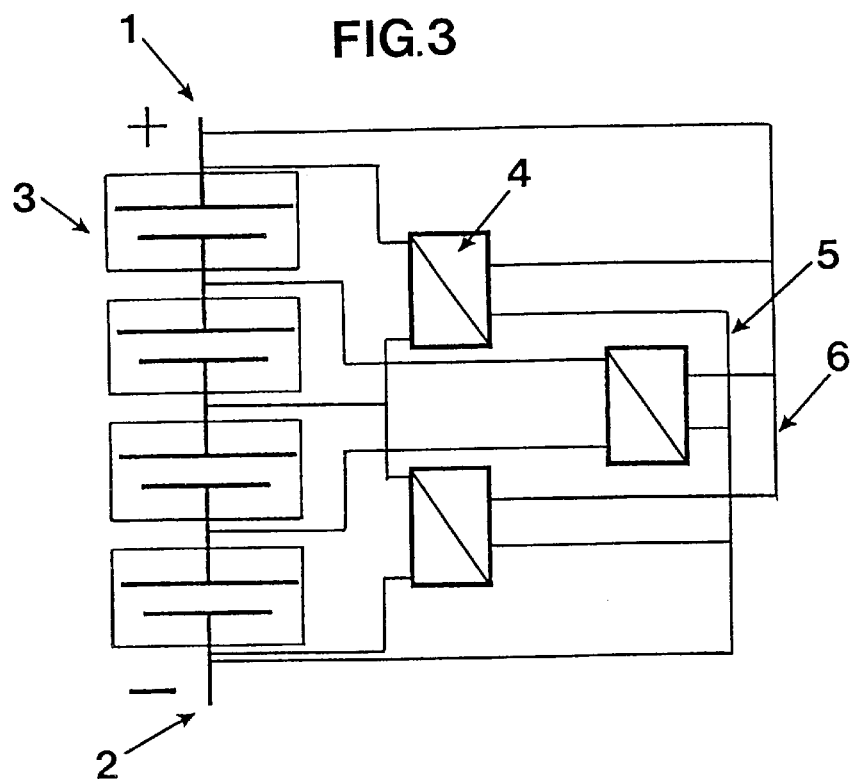
FIGS. 3–4 are alternate embodiments.

The voltage converters 4 are also provided with devices for sensing individual temperatures and pole voltages of the battery cells 3 or battery blocks 9. The voltage converters are controlled from a, for the battery assembly central control unit which via wire or wireless communicates with the voltage converters 4. The voltage converters mentioned above can also be connected in other ways to each battery cell 3 or battery block 9. FIG. 3 shows an example of a so called reduced connection i.e. the charging level of each battery cell can be controlled in spite of the fewer numbers of voltage converters than the number of battery cells.

Figure 4:
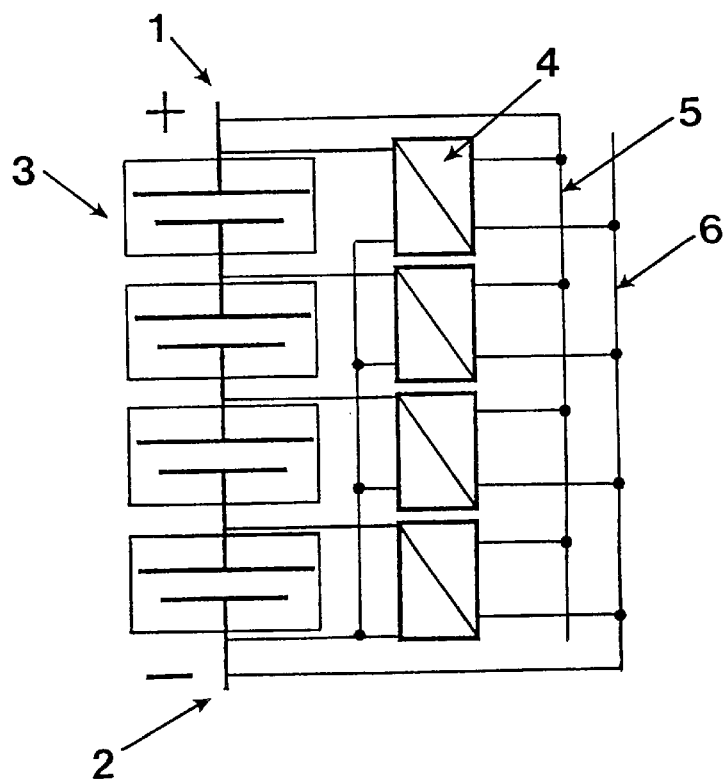

FIG. 4 shows an arrangement wherein the voltage converters have been connected to a common ground. This procedure is especially applicable in low voltage battery systems.

I claim:

1. A system for charge level equalization of a group of cells connected in series thereby forming a battery, comprising:

controllable voltage converter means having first conductor means and second conductor means, said first conductor means being coupled to said cells and said second conductor means being coupled to a common current path, said current path including positive and negative conductors, said converter means further including positive and negative conductors, said positive conductor being connected to the positive pole of the battery and said negative conductor being connected to the negative pole of the battery; whereby, the level of charging in each cell is controlled by said controllable voltage converter means to a desired level by transferring energy to or away from said cells.

2. A system as set forth in claim 1, wherein:

said voltage converter means measures the individual pole voltages of each of the cells and transmits said measured voltage values to a central control system coupled to said battery.

3. A system as set forth in claim 1, wherein:

said voltage converter means measures the temperature of each of the cells and transmits said measured temperature values to a central control system coupled to said battery.

4. A system as set forth in claim 1, wherein:

a plurality of said cells are grouped together to form block means.

5. A system as set forth in claim 4, wherein:

said block means is connected to said controllable voltage converter means.

6. A system as set forth in claim 1, wherein:

each cell is connected to a separate controllable voltage converter.

7. A system as set forth in claim 4, wherein:

each block means is connected to a separate controllable voltage converter.

8. A system as set forth in claim 4, wherein:

said cells being grouped together are connected in series.

* * * * *